United States Patent
Asami

(10) Patent No.: US 6,836,235 B2
(45) Date of Patent: Dec. 28, 2004

(54) INTERLEAVING AD CONVERSION TYPE WAVEFORM DIGITIZER

(75) Inventor: Koji Asami, Tokyo (JP)

(73) Assignee: Advantest Corporation, Tokyo (JP)

(*) Notice: Subject to any disclaimer, the term of this patent is extended or adjusted under 35 U.S.C. 154(b) by 0 days.

(21) Appl. No.: 10/643,484

(22) Filed: Aug. 19, 2003

(65) Prior Publication Data

US 2004/0032358 A1 Feb. 19, 2004

Related U.S. Application Data

(63) Continuation of application No. PCT/JP02/01429, filed on Feb. 19, 2002.

(30) Foreign Application Priority Data

Feb. 20, 2001 (JP) ........................................ 2001-044078

(51) Int. Cl.[7] ............................................... H03M 1/10
(52) U.S. Cl. ...................................... 341/155; 341/118
(58) Field of Search ................................. 341/118, 120, 341/141, 155

(56) References Cited

U.S. PATENT DOCUMENTS

| | | | | | |
|---|---|---|---|---|---|
| 4,763,105 | A | * | 8/1988 | Jenq ............................ | 341/120 |
| 5,239,299 | A | * | 8/1993 | Apple et al. ................. | 341/118 |
| 5,294,926 | A | * | 3/1994 | Corcoran .................... | 341/120 |
| 6,081,215 | A | * | 6/2000 | Kost et al. ................... | 341/120 |
| 6,384,756 | B1 | * | 5/2002 | Tajiri et al. .................. | 341/120 |

FOREIGN PATENT DOCUMENTS

| JP | 2000-307425 | 11/2000 | | |
|---|---|---|---|---|
| JP | 2000-346913 | 12/2000 | | |
| JP | 2000346913 A | * 12/2000 | ......... | G01R/31/137 |
| JP | 2002-100988 | 4/2002 | | |

OTHER PUBLICATIONS

Asami et al., A method to improve the performance of high–speed waveform digitizing, Proceeding International Test Conference, 1999. Meeting Date: Sep. 28, 1999 –Sep. 30, 1999 Publication Date: Sep. 28–30, 1999, page(s): 947–954.*
Patent Abstracts of Japan, Publication No. 2000–346913, Dec. 15, 2000, 1 pg.
Patent Abstracts of Japan, Publication No. 2000–307425, Nov. 2, 2000, 1 pg.
Patent Abstracts of Japan, Publication No. 2002–100988, Apr. 5, 2002, 1 pg.
International Search Report issued in PCT/JP02/01429 mailed May 28, 2002, 2 pgs.
International Preliminary Examination Report issued in PCT/JP02/01429 mailed Jan. 24, 2003, 4 pgs.
Translation of International Preliminary Examination Report dated Jan. 24, 2003 (4 pgs).

* cited by examiner

Primary Examiner—Howard L. Williams
(74) Attorney, Agent, or Firm—Osha & May L.L.P.

(57) ABSTRACT

A digitizer is provided which includes: N A/D converters for converting an analog signal output from an electronic device to digital signals at different sampling timings by turns (N is an integer equal to or larger than 2); and N digital filters for outputting corrected signals obtained by multiplying the digital signals output from the N A/D converters by correction coefficients, wherein the correction coefficients are based on phase errors between ideal sampling timings at which associated A/D converters are to sample the analog signal and actual sampling timings at which the N A/D converters sampled the analog signal, respectively.

17 Claims, 7 Drawing Sheets

INTERLEAVING AD CONVERSION TYPE WAVEFORM DIGITIZER

The present application is a continuation application of PCT application No. PCT/JP02/01429 filed on Feb. 19, 2002 which claims priority from a Japanese Patent Application No. 2001-44078 filed on Feb. 20, 2001, the contents of which are incorporated herein by reference.

BACKGROUND OF THE INVENTION

1. Field of the Invention

The present invention relates to an interleaving AD conversion type waveform digitizer. In particular, the present invention relates to a correction means for detecting a measurement error caused by a phase error of a sampling timing in interleaving AD conversion so as to correct the detected measurement error.

2. Related Art

An N-way interleaving AD conversion type waveform digitizer can increase an apparent sampling rate by using N A/D converters. This type of waveform digitizer is required to perform sampling at precise timings.

FIG. 7 shows a structure of a conventional digitizer 200 used in a testing apparatus for testing an electronic device. The digitizer 200 includes four A/D converters (ADCs) 110, four clocks 112, an interleaving unit 114 and a digital filter 116. Each A/D converter 110 samples an analog signal output from the electronic device based on timings supplied to the associated clock 112, thereby converting the analog signal to a digital signal. The interleaving unit 114 generates a data sequence obtained by arranging the digital signals converted by the four A/D converters 110 in a predetermined order. The digital filter 116 multiplies the data sequence generated by the interleaving unit 114 by a correction coefficient based on a predetermined impulse response function. The digital filter 116 removes a predetermined frequency component from the data sequence by the above multiplication. Then, the digital filter 116 outputs the data sequence multiplied by the correction coefficient to a determination unit of the testing apparatus. The determination unit determines based on the data sequence multiplied by the correction coefficient whether or not the electronic device is defective.

The four A/D converters have to be adjusted in phase in such a manner that the sampling timings thereof are arranged at constant phase intervals. In a case where the sampling timings of the respective A/D converters contain phase errors, the interleaving unit 114 and the digital filter 116 process the digital data output from the respective A/D converters while assuming that that digital data were obtained by sampling at constant intervals. As a result, the data sequence output from the digital filter 116 also contains an error with respect to the analog signal output from the electronic device. Therefore, the determination unit cannot precisely determine whether or not the electronic device under test is defective.

According to the conventional technique, the phase intervals between the sampling timings of the A/D converters were adjusted to be constant, as described above. On the other hand, the sampling characteristics of the A/D converter are affected by variation of parts in the A/D converter, the environmental temperature, the change with time, the fluctuation of supply voltage, thus affecting the sampling at constant intervals that is intended. Moreover, it was very difficult to supply clocks to a plurality of A/D converters so as to realize the sampling timings at constant phase intervals.

These factors cause the fluctuation of the sampling timing from ideal sampling timing. This made it difficult to precisely reproduce the analog signal output from the electronic device. Thus, it became difficult to precisely determine whether or not the electronic device is defective.

SUMMARY OF THE INVENTION

Therefore, it is an object of the present invention to provide an AD conversion type digitizer and a semiconductor testing apparatus that can correct phase shifts of sampling between a plurality of A/D converters so as to precisely reproduce an analog signal. The above and other objects can be achieved by combinations described in the independent claims. The dependent claims define further advantageous and exemplary combinations of the present invention.

In order to achieve the above object, according to the first aspect of the present invention, a digitizer for converting an analog signal output from an electronic device to a digital signal, includes: an A/D converter operable to sequentially convert the analog signal output from the electronic device to a digital signal at predetermined time intervals; a digital filter operable to output a corrected signal obtained by multiplying the digital signal converted by the A/D converter by a correction coefficient; and a digital filter operable to output a corrected signal obtained by multiplying the digital signal converted by the A/D converter by a correction coefficient based on a phase error between an ideal sampling timing at which the A/D converter is to sample the analog signal and an actual timing at which the A/D converter sampled the analog signal.

The digital filter may have an impulse response function given thereto for calculating the correction coefficient, and the digital filter may output the corrected signal obtained by calculating convolution of the correction coefficient, that is a value of the impulse response function corresponding to a timing away from the ideal sampling timing by the phase error, and values of the digital signal.

According to the second aspect of the present invention, a digitizer for converting an analog signal output from an electronic device to a digital signal, includes: N A/D converters operable to convert the analog signal output from the electronic device to digital signals at different sampling timings by turns, N being an integer equal to or larger than 2; and N digital filters operable to output corrected signals, each of the corrected signals being obtained by multiplying one of the digital signals output from an associated one of the N A/D converters by a correction coefficient based on a phase error between an ideal sampling timing at which the associated A/D converter is to sample the analog signal and an actual sampling timing at which the associated A/D converter sampled the analog signal.

Each of the N digital filters may include a memory in which an impulse response function for calculating the correction coefficient is stored, and the N digital filters may output the corrected signals each obtained by calculating convolution of the correction coefficient, that is a value of the impulse response function corresponding to a timing away from the ideal sampling timing by the phase error of the associated A/D converter, and values of the digital signal converted by the associated A/D converter. In addition, the memory may store the impulse response function based on gain characteristics of the associated A/D converter. Moreover, the memory may store the impulse response function based on frequency characteristics of the associated A/D converter.

Each of the N digital filters may include a memory for storing as the correction coefficient a value of an impulse response function of the digital filter at the actual sampling timing of the associated A/D converter, and the N digital filters may output the corrected signals each obtained by calculation of convolution of values of the digital signal converted by the associated A/D converter and the correction coefficient. In addition, the memory may store the correction coefficient based on gain characteristics of the associated A/D converter. Moreover, the memory may store the correction coefficient based on frequency characteristics of the associated A/D converter.

The digitizer may further include an interleaving unit operable to generate a data sequence obtained by arranging the corrected signals respectively output from the N digital filters in a predetermined order. Moreover, the digitizer may further include a decimation data generation unit operable to calculate a sum of the corrected signals respectively output from the plurality of digital filers to generate decimation data, wherein each of the N digital filters multiplies the digital signal output from the associated A/D converter by the correction coefficient based on: a phase error between the ideal sampling timing at which the associated A/D converter is to sample the analog signal and the actual sampling timing at which the associated A/D converter sampled the analog signal; and a phase difference between the ideal sampling timing of the associated A/D converter and an ideal sampling timing of one of the N A/D converters that is used as a reference A/D converter.

Each of the N digital filters may include a memory for storing a plurality of correction coefficients obtained by decomposing a predetermined impulse response function by a polyphase decomposition and multiplying results of the polyphase decomposition by a coefficient based on the phase error, and the N digital filters may output the corrected signals obtained by calculation of convolution of the plurality of correction coefficients and the digital signals. Moreover, the memory of each of the N digital filters may store, as the plurality of correction coefficients, values obtained by multiplying values of the impulse response function at the ideal sampling timings of the associated A/D converter by the coefficient based on the phase error. Furthermore, the memory of each of the N digital filters may store the plurality of correction coefficients based on a function obtained by moving the impulse response function on a time axis by a difference between a phase of the ideal sampling timing of the associated A/D converter and a phase of the ideal sampling timing of the reference A/D converter, and the phase error.

According to the third aspect of the present invention, a digitizer for converting an analog signal output from an electronic device to a digital signal, includes: N A/D converters operable to convert the analog signal output from the electronic device to digital signals at different sampling timings by turns, N being an integer equal to or larger than 2; a first interleaving unit operable to generate a first data sequence obtained by arranging the digital signals converted by the N A/D converters in a predetermined order to output the first data sequence; N digital filters operable to receive the first data sequence output from the first interleaving unit, to calculate convolution of correction coefficients based on phase errors between ideal sampling timings at which the N A/D converters are to sample the analog signal and actual sampling timings at which the N A/D converters sampled the analog signal and the first data sequence so that each of the N digital filters generate and output decimation data containing less number of data units than data units in the first data sequence; and a second interleaving unit operable to generate a second data sequence obtained by arranging the data units in the decimation data output from each of the N digital filters in a predetermined order.

In the third aspect of the present invention, the N digital filters may include memories operable to store impulse response functions for calculating the correction coefficients, and may output signals obtained by convolution of values of the impulse response functions corresponding to timings away from the ideal sampling timings by the phase errors of associated A/D converters and values of the digital signals converted by the associated A/D converters, respectively.

According to the fourth aspect of the present invention, a testing apparatus for testing an electronic device, includes: a pattern generator operable to generate a pattern signal and an expected-value signal; a waveform shaping unit operable to shape a waveform of the pattern signal generated by the pattern generator; a device contact unit, onto which the electronic device is to be placed, operable to supply the pattern signal shaped by the waveform shaping unit to the electronic device and to receive an analog signal output from the electronic device; a digitizer operable to convert the analog signal output from the electronic device to a digital signal; and a determination unit operable to determine based on the expected-value signal output from the pattern generator and a signal output from the digitizer whether or not the electronic device is defective, wherein the digitizer includes: an A/D converter operable to sequentially convert the analog signal output from the electronic device to digital signals at predetermined intervals; and a digital filter operable to output corrected signals calculated by multiplying the digital signals converted by the A/D converter by a correction coefficient, and the digital filer multiplies the digital signals by the correction coefficient based on a phase error between ideal sampling timings at which the A/D converter is to sample the analog signal and sampling timings at which the A/D converter sampled the analog signal.

According to the fifth aspect of the present invention, a testing apparatus for testing an electronic device, includes: a pattern generator operable to generate a pattern signal and an expected-value signal; a waveform shaping unit operable to shape a waveform of the pattern signal generated by the pattern generator; a device contact unit, onto which the electronic device is to be placed, operable to supply the pattern signal shaped by the waveform shaping unit to the electronic device and to receive an analog signal output from the electronic device; a digitizer operable to convert the analog signal output from the electronic device to a digital signal; and a determination unit operable to determine based on the expected-value signal output from the pattern generator and a signal output from the digitizer whether or not the electronic device is defective, wherein the digitizer includes: N A/D converters operable to convert the analog signal output from the electronic device to digital signals at different sampling timings, N being an integer equal to or larger than 2; and N digital filters operable to output corrected signals obtained by multiplying the digital signals output from the N A/D converters by correction coefficients, and wherein the N digital filters multiply the digital signals converted by associated A/D converters by the correction coefficients based on phase errors between ideal sampling timings at which the associated A/D converters are to sample the analog signal and sampling timings at which the N A/D converters sampled the analog signal.

The digitizer may further include a decimation data generation unit operable to calculate a sum of the corrected signals respectively output from the plurality of digital filters to generate decimation data, wherein the N digital filters output the corrected signals obtained by multiplying the digital signals converted by the associated A/D converters by the correction coefficients based on: phase errors between the ideal sampling timings at which the associated A/D converters are to sample the analog signal and the actual sampling timing at which the N A/D converters sampled the analog signal; and phase differences between the ideal sampling timings of the associated A/D converters and ideal sampling timings of one of the N A/D converters that is used as a reference.

According to the sixth aspect of the present invention, a testing apparatus for testing an electronic device includes: a pattern generator operable to generate a pattern signal and an expected-value signal; a waveform shaping unit operable to shape a waveform of the pattern signal generated by the pattern generator; a device contact unit, onto which the electronic device is to be placed, operable to supply the pattern signal shaped by the waveform shaping unit to the electronic device and to receive an analog signal output from the electronic device; a digitizer operable to convert the analog signal output from the electronic device to a digital signal; and a determination unit operable to determine based on the expected-value signal output from the pattern generator and a signal output from the digitizer whether or not the electronic device is defective, wherein the digitizer includes: N A/D converters operable to convert the analog signal output from the electronic device to digital signals at different sampling timings by turns, N being an integer equal to or larger than 2; a first interleaving unit operable to generate and output a first data sequence obtained by arranging the digital signals converted by the N A/D converters in a predetermined order; N digital filters operable to receive the first data sequence output from the first interleaving unit and to calculate convolution of correction coefficients, based on phase errors between ideal sampling timings at which the N A/D converters are to sample the analog signal and actual sampling timings at which the N A/D converters sampled the analog signal, and the first data sequence to generate and output decimation data, the decimation data of each of the N digital filters containing less number of data units than data units in the first data sequence; and a second interleaving unit operable to generate a second data sequence obtained by arranging the data units in the decimation data output from the N digital filters in a predetermined order.

The summary of the invention does not necessarily describe all necessary features of the present invention. The present invention may also be a sub-combination of the features described above.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
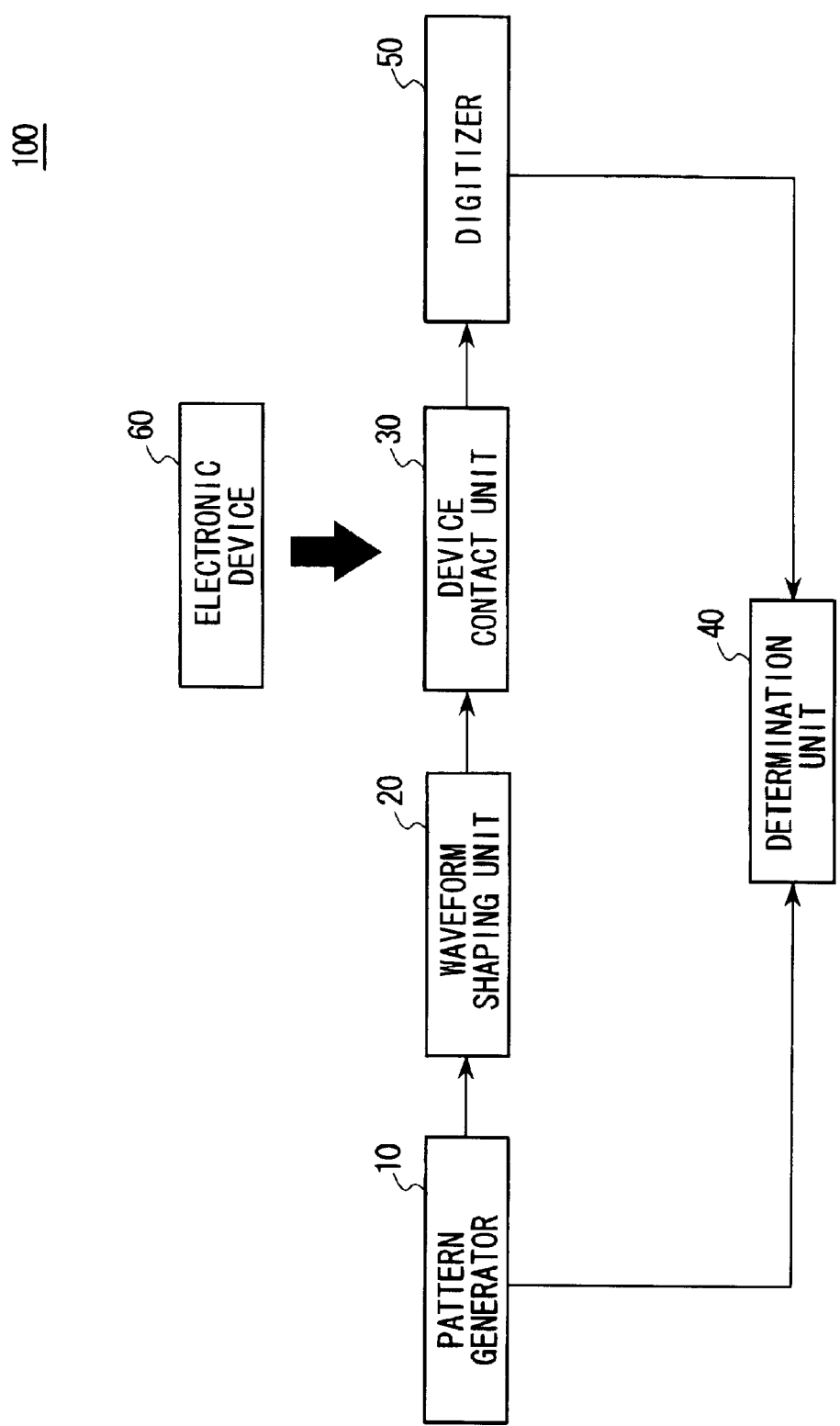
FIG. 1 shows an exemplary structure of a testing apparatus 100 according to the present invention.

FIG. 1 shows an exemplary structure of a testing apparatus 100 according to the present invention. The testing apparatus 100 includes a pattern generator 10, a waveform shaping unit 20, a device contact unit 30, a digitizer 50 and a determination unit 40. An electronic device 60 under test is placed onto the device contact unit 30. The pattern generator 10 generates an input signal to be supplied to the electronic device 60. The input signal thus generated is supplied to the waveform shaping unit 20. The waveform shaping unit 20 shapes the waveform of the input signal in accordance with the characteristics of the electronic device 60. The shaped input signal is supplied to the electronic device 60 via the device contact unit 30. The electronic device 60 outputs based on the input signal an analog signal to the digitizer 50 via the device contact unit 30. The digitizer 50 receives the analog signal and converts the received analog signal to a digital signal so as to supply the digital signal to the determination unit 40. The determination unit 40 determines based on the digital signal whether or not the electronic device 60 is defective. The pattern generator 10 may generate an expected-value signal based on the input signal that the pattern generator 10 generates, while the determination unit 40 may compare the expected-value signal generated by the pattern generator 10 with the digital signal received from the digitizer 50 so as to determine whether or not the electronic device 60 is defective.

Figure 2:
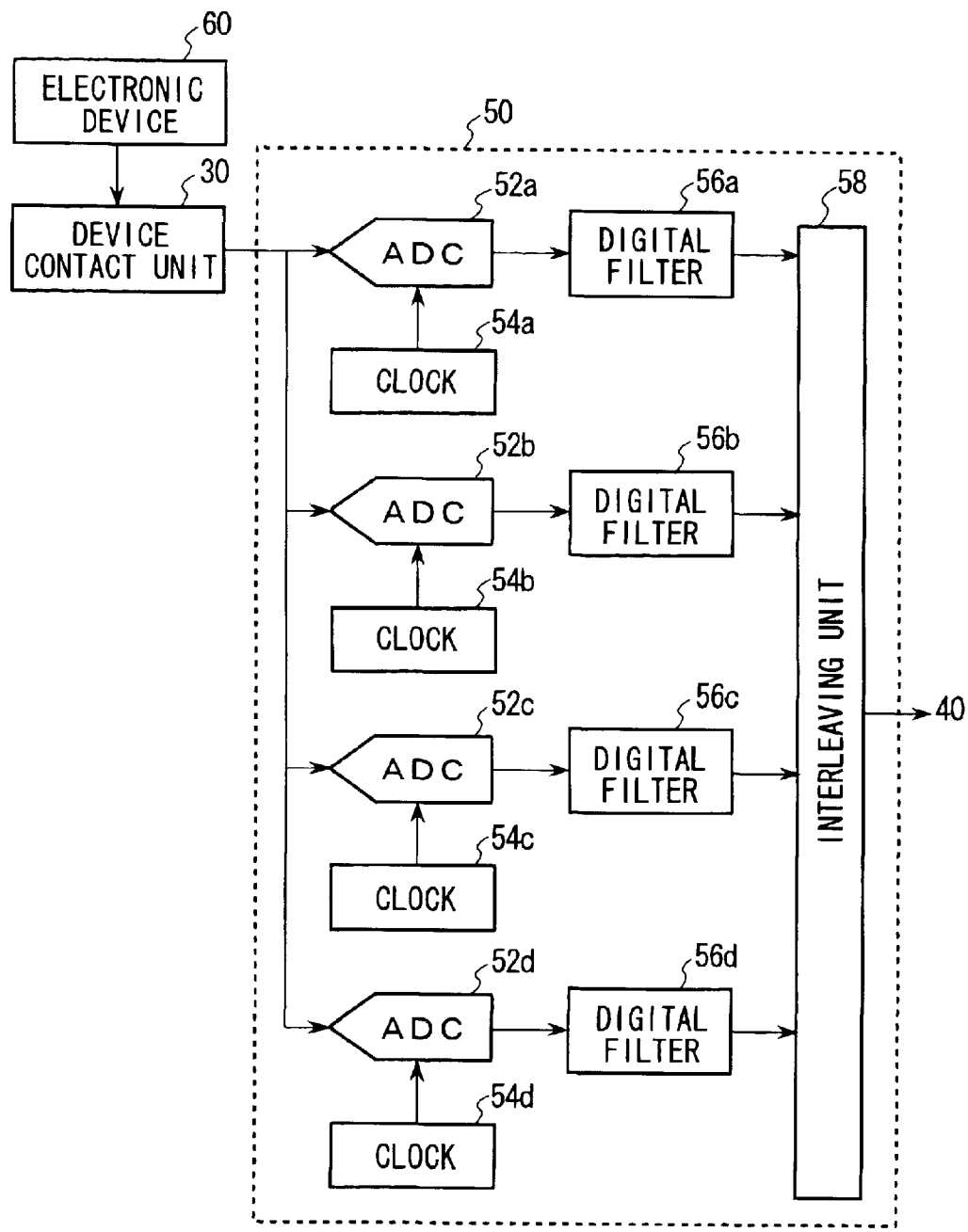
FIG. 2 shows an exemplary structure of a digitizer 50 according to the present invention.

FIG. 2 shows an exemplary structure of the digitizer 50 according to the present invention. The digitizer 50 includes N (N is an integer) A/D converters (ADCs) 52, digital filters 56 respectively corresponding to the A/D converters 52, clocks 54 each of which supplies sampling timings to the associated one of the A/D converters 52, and an interleaving unit 58. In the present example, the digitizer 50 includes four A/D converters 52.

The N A/D converters 52 convert the analog signal out put from the electronic device 60 to digital signals at different sampling timings by turns. Each of the N A/D converters 52 samples the analog signal at substantially the same frequency (fs). In the present example, the A/D converter 52a, the A/D converter 52b, the A/D converter 52c and the A/D converter 52d sample the analog signal by turns. Thus, by sampling the analog signal at constant phase intervals by means of these four A/D converters 52, the frequency of the sampling by the four A/D converters 52 is 4fs. However, since the four A/D converters 52 perform the sampling by turns, the phase intervals between the sampling timings are not constant in some cases. That is, the sampling timings at which the N A/D converters 52 sample the analog signal contain phase errors with respect to ideal sampling timings arranged at constant phase intervals. In the present example, in a case where the timing of the sampling by the A/D converter 52a is assumed to be reference, it is ideally desirable that the other A/D converters 52b, 52c and 52d perform the sampling at constant phase intervals between adjacent sampling timings of the A/D converter 52a. However, the sampling timings of the A/D converters 52b, 52c and 52d may contain the phase errors with respect to the ideal sampling timings actually.

Each digital filter 56 multiplies the digital signal output from the associated A/D converter 52 by a correction coefficient for correcting the phase error. In other words, the N digital filters 56 multiply the digital signals output from the N A/D converters 52 corresponding thereto by correction coefficients so as to obtain corrected signals, respectively, and then output the obtained corrected signals to the interleaving unit 58. In this multiplication, each correction coefficient is based on the phase error between the ideal sampling timings at which the associated A/D converter 52 is to sample the analog signal and actual sampling timings at which the respective N A/D converters 52 sampled the analog signal. The digital filter 56 may be a finite impulse response (FIR) filer, for example. Moreover, it is preferable that the digital filter 56 is a linear-phase finite impulse response filter and is a filter having characteristics freely changeable.

The interleaving unit 58 generates a data sequence that is obtained by arranging the corrected signals respectively output from the N digital filters 56 in a predetermined order. That is, the interleaving unit 58 does not change the order of data units in data series of each corrected signal but arranges data units of the corrected signals in a predetermined order, thereby generating the data sequence.

The N digital filters 56 may include memories in which impulse response functions for calculating the correction coefficients of the respective digital filters 56 are stored. In this case, it is preferable that each of the N digital filters 56 outputs the corrected signal obtained by calculating convolution of the correction coefficient, that is a value of the impulse response function corresponding to the time away from the ideal sampling timing of the associated A/D converter by the phase error of the associated A/D converter, and a value of the digital signal converted by the associated A/D converter 52. Next, an exemplary method for calculating the corrected signal in the digital filter 56 is described.

Figure 3:
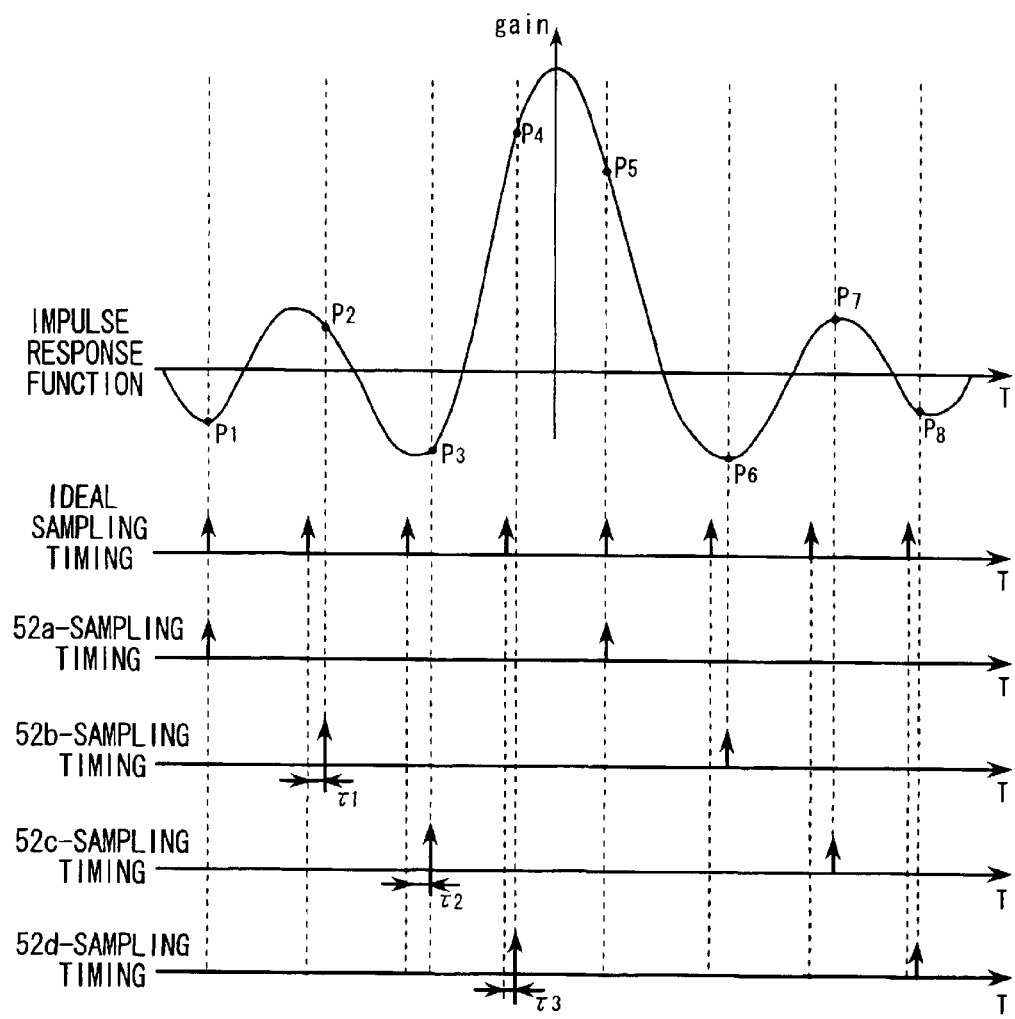
FIG. 3 shows a waveform of an impulse response function stored in a memory of a digital filter 56 and sampling timings of A/D converters 52.

FIG. 3 shows a waveform of the impulse response function stored in the memory of the digital filter 56 and the sampling timings of the A/D converters 52. In FIG. 3, the horizontal axis represents time while the vertical axis in the part showing the waveform of the impulse response function represents the gain of the digital filter 56. In the present example, a case where four A/D converters 52 are provided, as shown in FIG. 2, and the impulse response functions of the digital filters 56 are the same is described. An ideal sampling timing part shows the ideal sampling timings at which the four A/D converters 52 are to sample the analog signal output from the electronic device 60. A 52*a*-sampling timing part shows the actual sampling timings at which the A/D converter 52*a* in FIG. 2 actually samples the analog signal; a 52*b*-sampling timing part shows the actual sampling timings at which the A/D converter 52*b* in FIG. 2 actually samples the analog signal; a 52*c*-sampling timing part shows the actual sampling timings at which the A/D converter 52*c* in FIG. 2 actually samples the analog signal; and a 52*d*-sampling timing part shows the actual sampling timings at which the A/D converter 52*d* in FIG. 2 actually samples the analog signal.

As described above, in some cases the actual sampling timings at which the N A/D converters 52 actually sample the analog signal contain the phase errors with respect to the ideal sampling timings. In the present example, when the sampling timing of the A/D converter 52*a* is used as reference, the actual sampling timings of the A/D converters 52*b*, 52*c* and 52*d* contain the phase errors of $\tau_1$, $\tau_2$ and $\tau_3$ with respect to the ideal sampling timings, respectively. The digital filter 56 outputs the corrected signal obtained by calculating convolution of the correction coefficient, that is a value of the impulse response function corresponding to the timing away from the ideal sampling timing by the phase error of the associated A/D converter 52, and a value of the digital signal converted by the associated A/D converter 52. That is, the digital filter 56 outputs the corrected signal obtained by calculating convolution of the digital signal output from the associated A/D converter 52 and the value of the impulse response function at the actual sampling timing of the associated A/D converter 52. It is preferable that the phase error of each A/D converter is given in advance. The phase error of each A/D converter can be easily calculated, for example, based on the result of sampling of a predetermined analog signal. Next, convolution operation in the digital filter 56 is described.

It is assumed that a data series output from the A/D converter 52 is x(n) and a value of the impulse response function of the associated digital filter 56 at the actual sampling timing of that A/D converter 52 is represented by h(n). In this case, the corrected signal output from the associated digital filter 56, y(n), is represented by the following expression. The number of data units included in the data series x(n) and the number of the data units included in h(n) may be the same.

$$y(n) = \sum_{m=0}^{N-1} x(m)h(n-m)$$

In the above expression, N represents the number of the data units included in h(n). Moreover, it is preferable to determine the number of the data units included in the data series x(n) of the digital signal that was output from the A/D converter 52 and was then input to the digital filter 56 based on the sampling frequency fs of the A/D converter 52 and the impulse response function. According to the digitizer described above, the operation for correction in the digital filter 56 is performed using the correction coefficient based on the phase error in the actual sampling timing of the A/D converter 52. Thus, it is possible to generate the corrected signal in which the phase error has been corrected and is also possible to precisely reproduce the analog signal output from the electronic device 60. In addition, according to the testing apparatus 100 of the present invention, it is possible to precisely determine whether or not the electronic device 60 is defective. Moreover, although the digitizer 50 including four A/D converters 52 has been described in the present example, it is apparent that, in a digitizer including N A/D converters 52, it is also possible to generate the corrected signals in which the phase errors have been corrected and to precisely reproduce the analog signal by performing the similar operation to the operation described in the present example.

In the present example, the N digital filters 56 store the same impulse response function in the memories of the respective digital filters 56. However, in an alternative example, the memory of each digital filter 56 may store the impulse response function based on the gain characteristics of the associated A/D converter 52. In other words, it is preferable that the memories of the digital filters 56 store the impulse response functions that correct the difference between the gain characteristics of the N A/D converters 52, respectively. Moreover, the memory of each digital filter 56 may store the impulse response function based on the frequency characteristics of the associated A/D converter 52. In other words, it is preferable that the digital filter 56 store the impulse response function that corrects the difference of the gain characteristics between the frequencies in the associated A/D converter 52.

In the present example, the memories of the N digital filters store the impulse response functions, respectively. However, in an alternative example, the memories of the N digital filters may store the correction coefficients calculated based on the impulse response functions. For example, the memory of the digital filter may store a table of correction coefficients calculated by the above-mentioned operation, respectively. Moreover, the memory of the digital filter may store a table of correction coefficients corresponding to a plurality of phase errors or actual sampling timings in advance. That is, each of the N digital filters 56 may include a memory for storing, as a correction coefficient, a value in the impulse response function representing the characteristics of that digital filter 56 at the actual sampling timing of the associated A/D converter 52. The memory preferably stores a table of correction coefficients corresponding to a plurality of actual sampling timings. In this case, each of the N digital filters 56 outputs the corrected signal obtained by calculating convolution of the values of the digital signal of the associated A/D converter 52 and the table of correction coefficients selected based on the phase error or actual sampling timing.

Moreover, also in the case where the memory stores the correction coefficient table, it is preferable that the memory store the correction coefficient based on the gain characteristics of the associated A/D converter 52 as in the case where the memory stores the impulse response function. In addition, it is preferable that the memory store the correction coefficient based on the frequency characteristics of the associated A/D converter 52.

Figure 4:
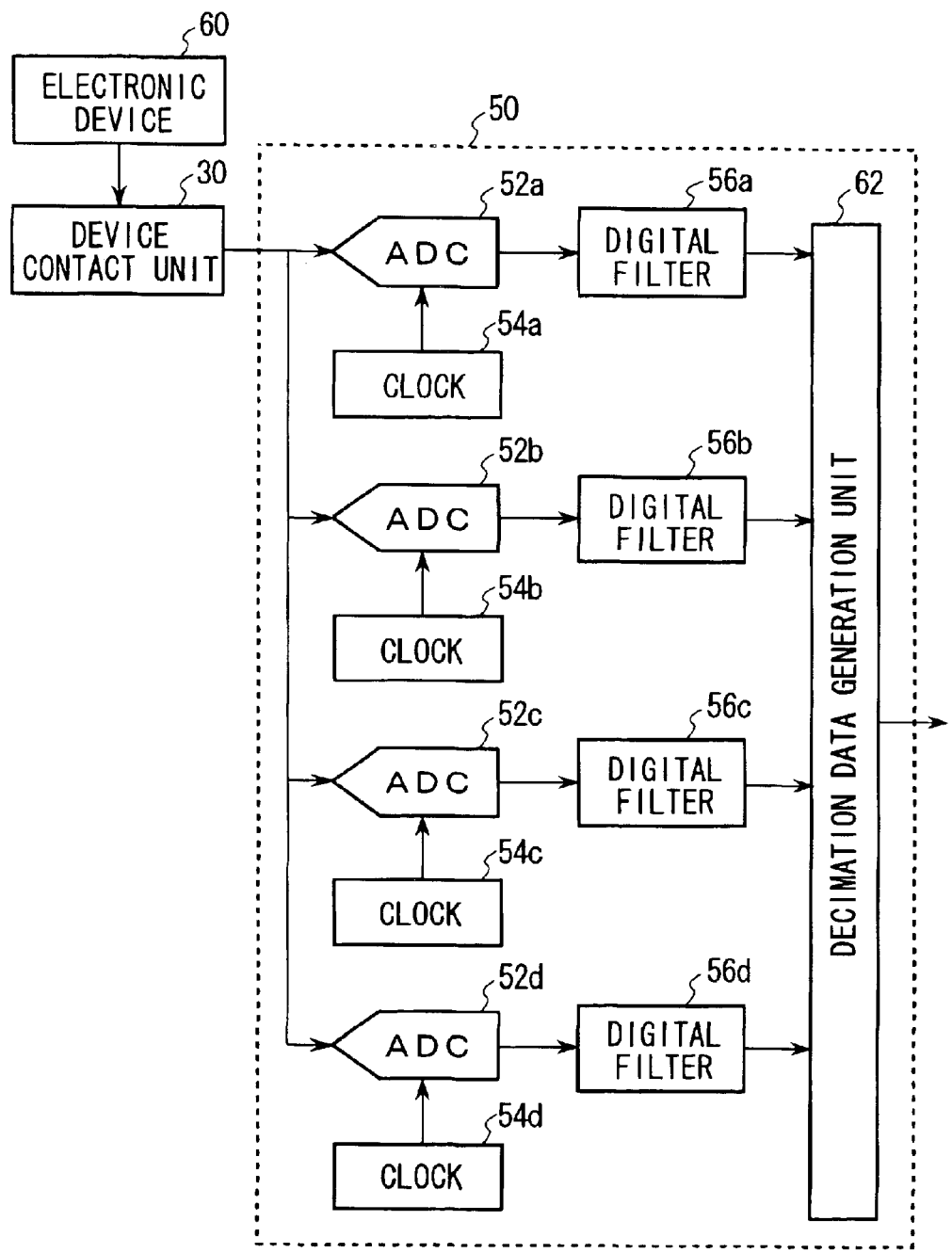
FIG. 4 shows another exemplary structure of the digitizer 50 according to the present invention.

FIG. 4 shows another exemplary structure of the digitizer 50 according to the present invention. In FIG. 4, the components labeled with the same reference numerals as those appearing in FIG. 2 may have the same or similar functions and structures as/to the components described referring to FIGS. 2 and 3. In this example, the digitizer 50 includes four A/D converters 52, clocks 54 that supply timings to the A/D converters 52, respectively, digital filters 56 respectively corresponding to the A/D converters 52 and a decimation data generation unit 62. The A/D converters 52 and the clocks 54 have the same or similar functions and structures as/to the A/D converters 52 and the clocks 54 described referring to FIGS. 2 and 3.

The digital filter 56 outputs a corrected signal obtained by multiplying a digital signal converted by the associated A/D converter 52 by a correction coefficient based on a phase error between an ideal sampling timing at which the associated A/D converter 52 is to sample the analog signal and an actual sampling timing at which the associated A/D converter 52 actually sampled the analog signal and a phase difference between the ideal sampling timing of the associated A/D converter 52 and an ideal sampling timing of the A/D converter 52 that is used as reference. In other words, the digital filter 56 corrects the digital signal from the associated A/D converter 52 with the phase error in the associated A/D converter 52 and also converts the digital signal after the correction into a signal sampled at different sampling timings, so as to output the resultant signal as the corrected signal. For example, it is assumed that the ideal sampling timings of the A/D converter 52a at which the A/D converter 52a should sample the analog signal are $T_1$, $T_5$, $T_9$, ... and the ideal sampling timings of the A/D converter 52b at which the A/D converter 52b should sample the analog signal are $T_2$, $T_6$, $T_{10}$, ... In this case, the digital filter 56b converts in phase the digital signal sampled by the A/D converter 52b at the timings of $T_2$, $T_6$, $T_{10}$, ... to a digital signal sampled at the timings of T1, T5, T9, ... and also corrects the phase error in the A/D converter 52b with respect to the ideal sampling timings.

The decimation data generation unit 62 calculates the sum of the corrected signals respectively output from the digital filters 56 to generate decimation data. More specifically, the decimation data generation unit 62 calculates the sum of the corrected signals which have been subjected to phase conversion in the respective digital filters 56, thereby generating decimation data equivalent to a digital signal sampled at a lower frequency than the sampling frequency at which the N A/D converters 52 actually sampled the analog signal. The decimation data generation unit 62 outputs the thus generated decimation data to the determination unit 40. Next, the operations of the digital filter 56 and decimation data generation unit 62 are described.

Figure 5:
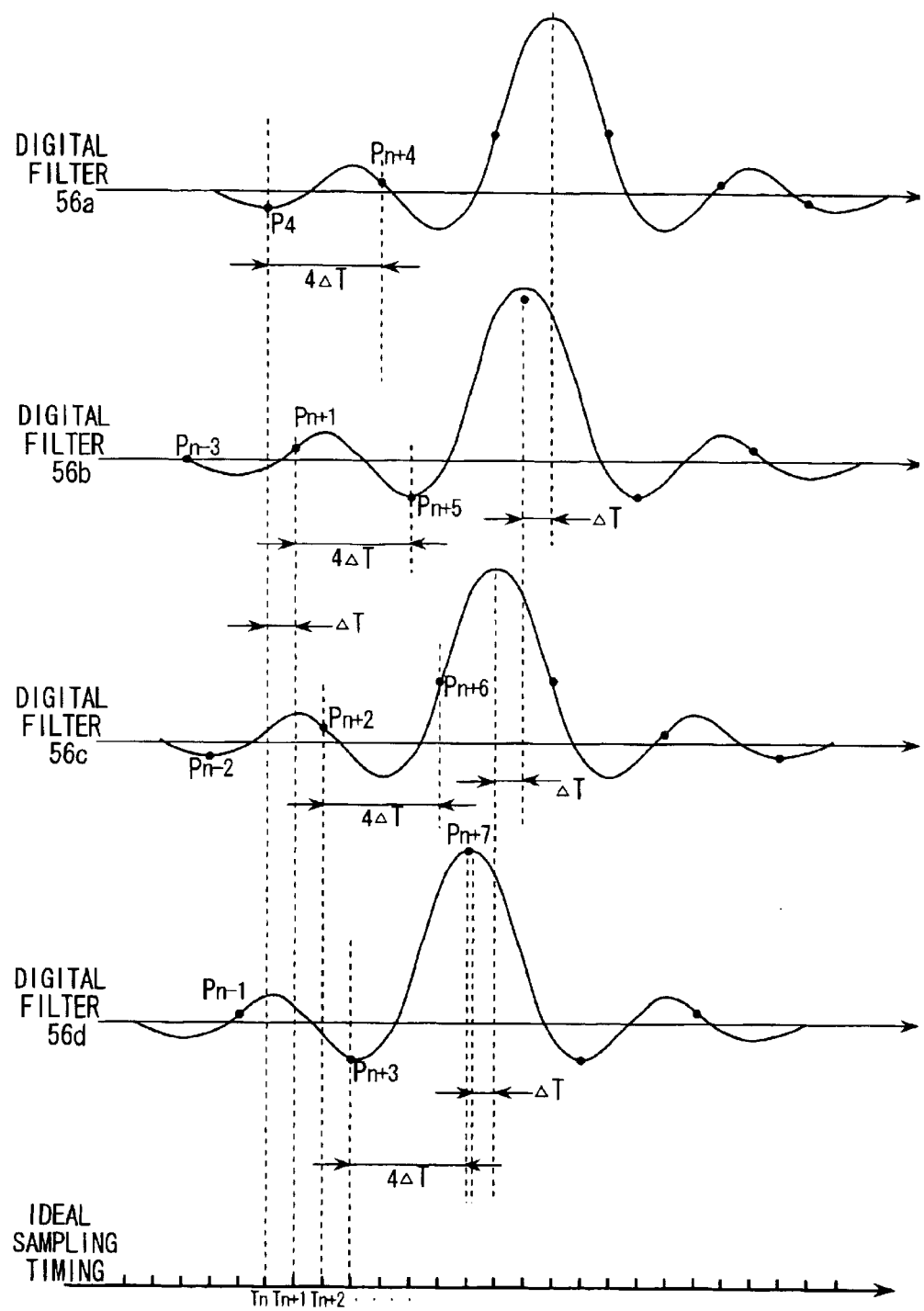
FIG. 5 shows an exemplary impulse response function of each digital filter 56.

FIG. 5 shows exemplary impulse response functions of the respective digital filters 56. The four A/D converters 52 ideally sample the analog signal by turns at constant intervals ($\Delta T$) as shown in FIG. 5. However, there may exist phase errors between the actual sampling timings at which the four A/D converters 52 actually sample the analog signal and the ideal sampling timings. In the present example, while the actual sampling timing at which the A/D converter 52a performs the sampling is assumed to be reference, the A/D converters 52b, 52c and 52d have the phase errors of $\tau_1$, $\tau_2$ and $\tau_3$, respectively, with respect to the ideal sampling timing.

The four digital filters 56 corresponding to the four A/D converters 52 have impulse response functions given thereto, and correct the digital signals output from the associated A/D converters 52 based on the impulse response functions, respectively. To each of the four digital filters 56, a function is given that is obtained by moving the impulse response function on the time axis by a difference between the phase of the ideal sampling timing of the associated A/D converter 52 and the phase of the ideal sampling timing of the A/D converter 52 used as reference. In the present example, to each of the four digital filters 56, the impulse response function is given that is obtained by moving the impulse response function of the A/D converter 52a on the time axis in the negative direction by a phase difference between the ideal sampling timing of the associated A/D converter 52 and the ideal sampling timing of the A/D converter 52a. Each digital filter 56 calculates convolution of the value of the given impulse response function at the ideal sampling timing of the associated A/D converter 52 and the digital signal output from the associated A/D converter 52.

In the present example, the digital filter 56a calculates convolution of the values of the impulse response function at the ideal sampling timings, $P_n$, $P_{n+4}$, ... and the digital signal, as shown in FIG. 5. $P_n$, $P_{n+4}$, ... are the values of the impulse response function appearing at the intervals of $4\Delta T$. Similarly, the digital filter 56b calculates convolution of the values of the impulse response function at the ideal sampling timing, $P_{n-3}$, $P_{n+1}$, ... and the digital signal. The digital filters 56c and 56d also calculate convolution of the values of the impulse response functions at the ideal sampling timings and the digital signals similarly.

Each digital filter 56 multiplies the result of convolution by a coefficient based on a phase error of the associated A/D converter. In a case where the phase errors of the A/D converters 52b, 52c and 52d are assumed to be $\tau_1$, $\tau_2$ and $\tau_3$, respectively, the digital filter 56b multiplies the result of convolution by $e^{\wedge}(jw\tau_1)$; the digital filter 56c multiplies the result of convolution by $e^{\wedge}(jw\tau_2)$; and the digital filter 56d multiplies the result of convolution by e^(jWτ₃). In this manner, the digital filters 56b, 56c and 56d output corrected signals in which the phase errors have been corrected.

Since each digital filter 56 has an impulse response function given thereto which is obtained by moving the impulse response function on the time axis by the phase difference between the ideal sampling timing of the associated A/D converter 52 and the ideal sampling timing of the reference A/D converter 52, the digital filter 56 can convert in phase the digital signal sampled by the associated A/D converter 52 to a digital signal sampled at the ideal sampling timings of the reference A/D converter 52. In the present example, the digital filers 56 convert in phase the digital signals sampled by the associated A/D converters 52 to digital signals sampled by the ideal sampling timings of the A/D converter 52a, respectively. The decimation data generation unit 62 calculates the sum of the corrected signals, i.e., the digital signals that are obtained by phase conversion and are output from the digital filters 56, so that the decimation data generation unit 62 can convert the digital signal sampled at the frequency of 4fs by interleaving sampling of the analog signal with the four A/D converters 52 to a digital signal sampled by the frequency of fs and correct the phase errors of the A/D converters 52.

In the present example, one of the A/D converters 52 is used as the reference and the digital signals sampled by the other A/D converters 52 are subjected to phase conversion. However, in an alternative example, a plurality ones of the A/D converters 52 may be used as the reference and the digital signals sampled by the remaining A/D converters may be subjected to phase conversion. For example, when a case is considered where the A/D converters 52a and 52c are used as the reference, the digital signal output from the A/D converter 52b may be converted in phase to a digital signal at the ideal sampling timings of the A/D converter 52a, and the digital signal output from the A/D converter 52d may be converted in phase to a digital signal at the ideal sampling timings of the A/D converter 52c. In this case, it is possible to convert the digital signal sampled with the four A/D converters 52 at the sampling frequency of 4fs to a digital signal sampled at the sampling frequency of 2fs. In addition, although the digitizer 50 including the four A/D converters 52 has been described in the present example, it is also possible in a digitizer 50 including N A/D converters 52 to convert a digital signal sampled at the sampling frequency of Nfs with the N A/D converters 52 to a digital signal having the sampling frequency equal to a given integral multiple of the sampling frequency fs of a single A/D converter 52. That is, according to the digitizer 50 of the present invention, a multi-rate digitizer can be realized that can sample the analog signal output from the electronic device 60 at a given frequency and can correct the phase errors in the respective A/D converters 52.

The digital filters 56 in the present example may have the impulse response functions based on the gain characteristics and/or the frequency characteristics of the associated A/D converters 52 as is the case with the digital filters 56 described referring to FIGS. 2 and 3. Moreover, the digital filters 56 may include memories for storing the impulse response functions, respectively. Furthermore, the digital filters 56 may include memories for storing tables of correction coefficients based on the impulse response functions in advance. That is, the memory of each of the N digital filters 56 may store, as a plurality of correction coefficients, valued obtained by multiplying values of the impulse response function at the ideal sampling timings of the associated A/D converter 52 by the coefficient based on the phase error.

For example, the N digital filters 56 may include memories for storing correction coefficients obtained by decomposing a predetermined impulse response function by polyphase decomposition and multiplying the result of the polyphase decomposition by coefficients based on the phase errors of the associated A/D converters 52, respectively. For example, in a case where the digitizer 50 includes four digital filters 56, an impulse response is given to each digital filter 56, which is obtained by decomposing a predetermined impulse response function K(z) by polyphase decomposition in which the decomposing number is four and then moving the decomposed impulse response on the time axis by the phase based on the ideal sampling timing of the associated A/D converter 52. When the impulse responses given to the digital filters 56a, 56b, 56c and 56d are assumed to be $E_0$, $E_1$, $E_2$ and $E_3$, respectively, values constituting the respective impulse responses are determined in a case of FIG. 5, as follows: $E_0=(P_n, P_{n+4}, \ldots)$, $E_1=(P_{n-3}, P_{n+1}, \ldots)$, $E_2=(P_{n-2}, P_{n+2} \ldots)$ and $E_3=(P_{n-1}, P_{n+3}, \ldots)$.

Each digital filter 56 calculates convolution of the values obtained by multiplying the values of the given impulse response by the coefficient based on the phase error in the associated A/D converter 52, and the digital signal output from the associated A/D converter 52, and then outputs the result of the convolution as the corrected signal. That is, in a case where the ideal sampling timings of the A/D converter 52a are assumed to be the reference, the digital filter 56a calculates convolution of the impulse response $E_0$ and the digital signal; the digital filter 56b calculates convolution of the correction coefficient obtained by multiplying the impulse response $E_1$ by e^(jwτ₁) and the digital signal; the digital filter 56c calculates convolution of the correction coefficient obtained by multiplying the impulse response $E_2$ by e^(jwτ₂) and the digital signal; and the digital filter 56d calculates convolution of the correction coefficient obtained by multiplying the impulse response $E_3$ by e^(jwτ₃) and the digital signal. Then, the digital filters 56a, 56b, 56c and 56d output the results of the convolution as the corrected signals, respectively. As an example, a transfer function H(z) of the impulse response in the four digital filters 56 is given by the following expression.

$$H(z)=E_0(z^4)+e^{jw\tau_1}E_1(z^4)z^{-1}+e^{jw\tau_2}E_2(z^4)z^{-2}+e^{jw\tau_3}(z^4)z^{-3}$$

Figure 6:
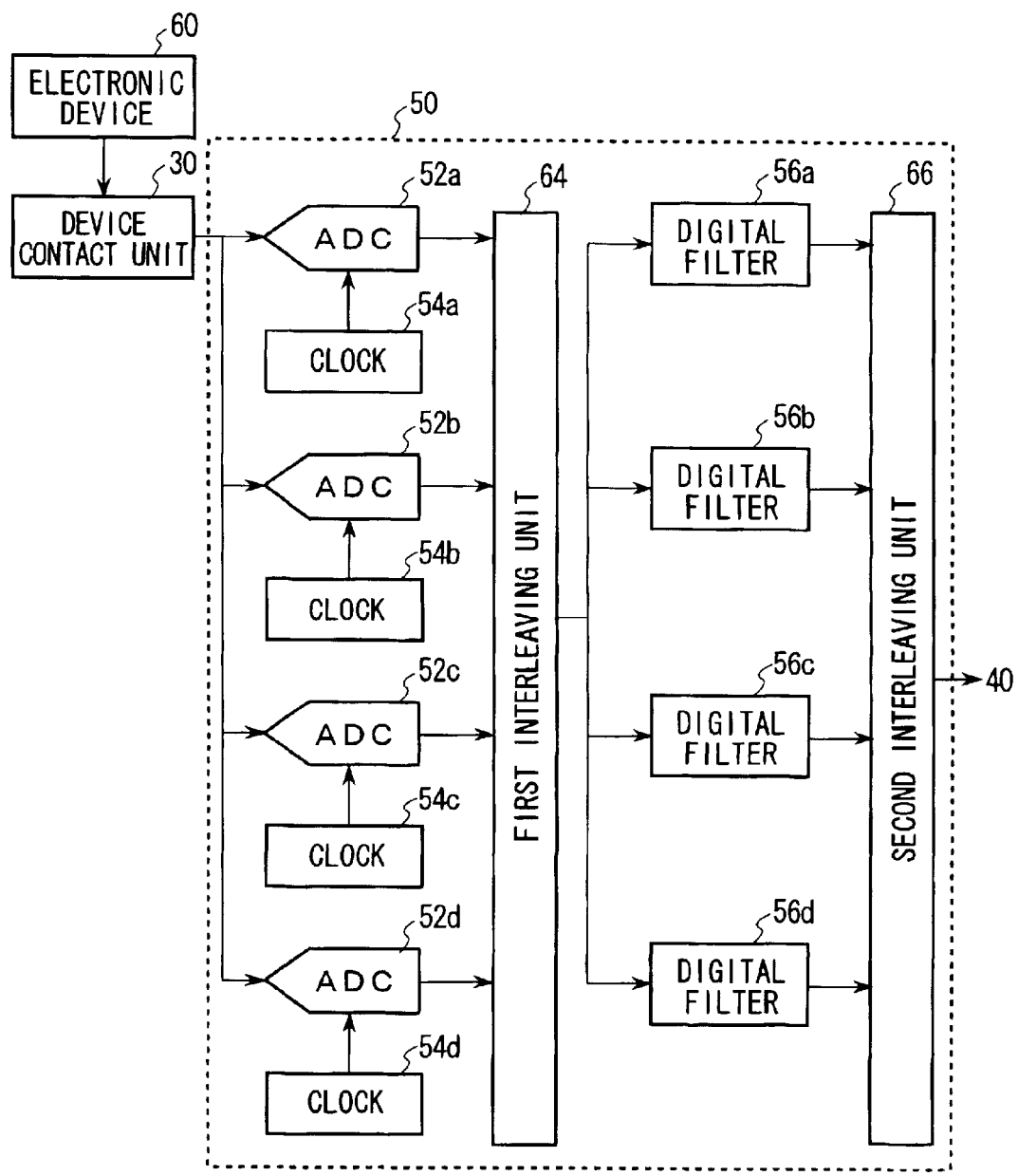
FIG. 6 shows still another example of the structure of the digitizer 50 according to the present invention.
Figure 7:
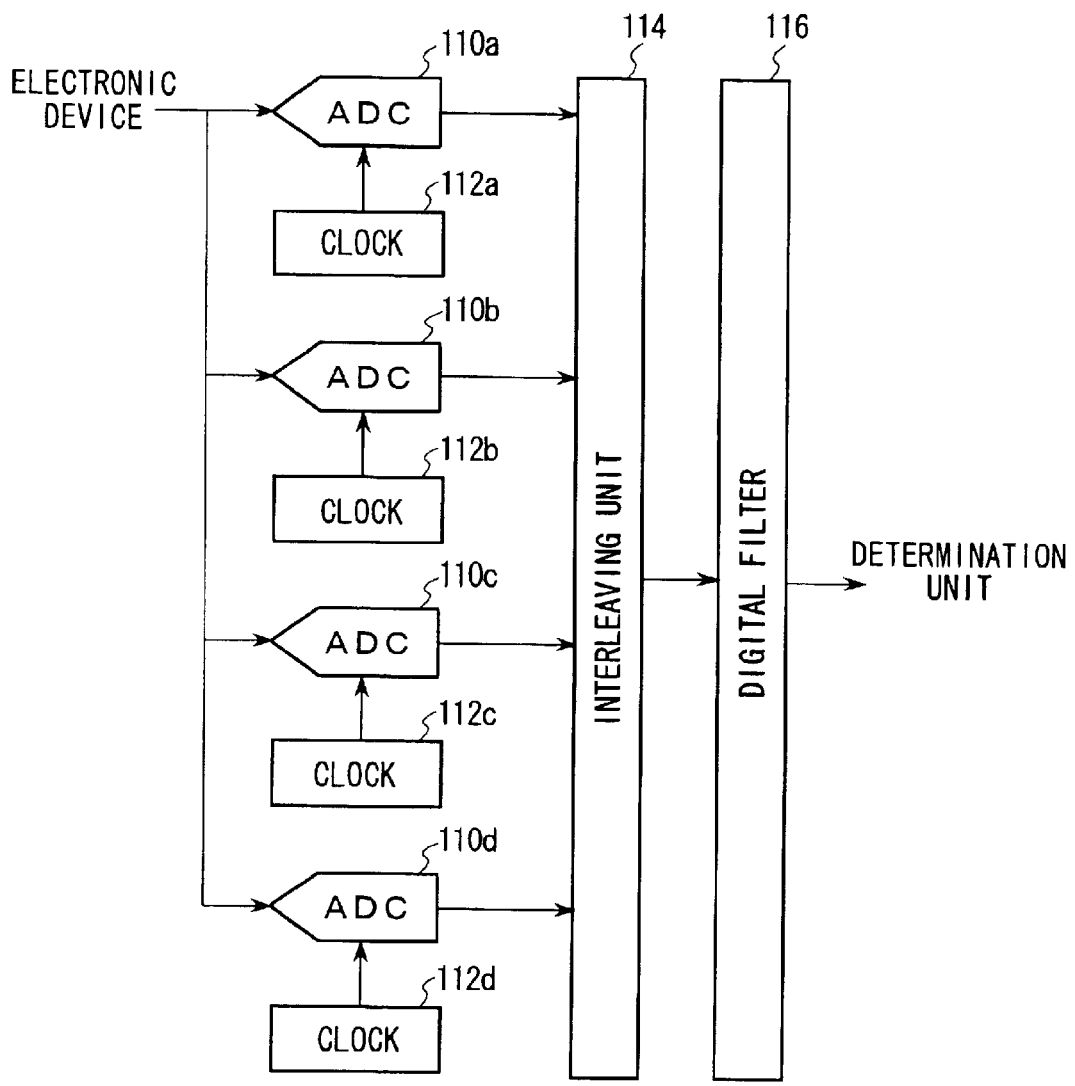
FIG. 7 shows a structure of a conventional digitizer 200.

FIG. 6 shows still another exemplary structure of the digitizer 50 according to the present invention. The digitizer 50 includes N A/D converters 52, N clocks 54, N digital filters 56, the first interleaving unit 64, and the second interleaving unit 66. The A/D converters 52 and the clocks 54 shown in FIG. 6 have the same or similar functions and structures as/to the A/D converters 52 and the clocks 54 described referring to FIGS. 2 and 3. Moreover, the digital filters 56 shown in FIG. 6 have the same or similar function and structure as/to the digital filters 56 described referring to FIGS. 4 and 5.

The first interleaving unit 64 generates the first data sequence obtained by arranging digital signals converted by the N A/D converters 52 in a predetermined order and then outputs the first data sequence. Each of the digital filters 56 receives the first data sequence output from the first interleaving unit 64, and calculates convolution of the correction coefficient, that is based on the phase difference between an ideal sampling timing at which the associated one of the N A/D converters 52 is to sample the analog signal and the actual sampling timing at which the associated A/D converter 52 sampled the analog signal, and the first data sequence, thereby generating decimation data in which the number of the contained data units is less than the number of the data units in the first data sequence. The generated decimation data is output. The digital filter 56 may include the decimation data generation unit described referring to FIG. 4. The digital filter 56 generates that decimation data by the same or similar operation as/to the operation described referring to FIGS. 4 and 5. The second interleaving unit 66 generates the second data sequence obtained by arranging the data units in the decimation data output from the N digital filters 56 in a predetermined order.

For example, a case is considered where the A/D converters 52 output data series $x_a(n)$, $x_b(n)$, $x_c(n)$ and $x_d(n)$ of the digital signals, respectively. Then, the first interleaving unit 64 arranges the data units of data series $x_a(n)$ $x_b(n)$, $x_c(n)$ and $x_d(n)$ in a predetermined order without changing the order of data units in each data series, thereby generating the first data sequence $y(4n)$. When the number of the data units in each data series $x_a(n)$, $x_b(n)$, $x_c(n)$, $x_d(n)$ is assumed to be n, the number of the data units in the first data sequence $y(4n)$ is $4n$. The digital filters 56 receive the first data sequence $y(4n)$ and then generate decimation data $z_a(m)$, $z_b(m)$, $z_c(m)$ and $z_d(m)$ containing the data units the number of which is less than $4n$, respectively. The digital filters 56 generate the decimation data $z_a(m)$, $z_b(m)$, $z_c(m)$ and $z_d(m)$ that are obtained by phase-converting the received data series $x_a(n)$, $x_b(n)$, $x_c(n)$ and $x_d(n)$ to data series in a case where the associated A/D converters perform the sampling at the ideal sampling timings. The second interleaving unit 66 generates the second data sequence obtained by arranging the data units of the decimation data $z_a(m)$, $z_b(m)$, $z_c(m)$ and $z_d(m)$ in a predetermined order.

For example, when the number of the data units in each data series $x_a(n)$, $x_b(n)$, $x_c(n)$, $x_d(n)$ is assumed to be one, the number of the data units in the first data sequence is four. Each digital filter 56 may receive the first data sequence containing four data units and generate the decimation data containing one data unit so as to output the thus generated decimation data. In this case, the second interleaving unit 66 generates the second data sequence containing four data units. As described above, according to the digitizer 50 of the present example, even in a case where the sampling rate is reduced by calculation of convolution in the digital filters 56, it is possible to substantially prevent the reduction of sampling rate and is also possible to correct the phase errors in the A/D converters 52. Although the digitizer 50 includes four A/D converters 52 in the present example, it is also possible in the digitizer 50 including N A/D converters 52 to prevent the reduction of the sampling rate and to correct the phase errors in a similar manner.

Although the present invention has been described by way of exemplary embodiments, it should be understood that those skilled in the art might make many changes and substitutions without departing from the spirit and the scope of the present invention which is defined only by the appended claims.

As is apparent from the above, according to the digitizer of the present invention, it is possible to correct the phase errors in the A/D converters and to precisely convert the analog signal output from the electronic device to the digital signal. Moreover, according to the testing apparatus of the present invention, it is possible to precisely convert the analog signal output from the electronic device to the digital signal so as to allow the precise determination whether or not the electronic device is defective. Furthermore, the sampling frequency at which the analog signal is sampled can be changed easily.

What is claimed is:

1. A digitizer for converting an analog signal output from an electronic device to a digital signal, comprising:

a plurality of A/D converters including a first A/D converter and a second A/D converter for converting the analog signal output from said electronic device to digital signal at a different sampling timing from each other by turns; and a plurality of digital filters including a first digital filter receiving the converted digital signal from the first A/D converter and a second digital filter receiving the converted digital signal from the second A/D converter, each of said first digital filter and said second digital filter for obtaining a correction coefficient based on a phase error in sampling timing of said associated A/D converter, multiplying said associated converted digital signal by said correction coefficient, and outputting each corrected digital signal.

2. A digitizer as claimed in claim 1, wherein each of said first digital filter and said second digital filter includes a memory in which an impulse response function for calculating said correction coefficient is stored, and said first digital filter and said second digital filter output said corrected signals each obtained by calculating convolution of said correction coefficient, that is a value of said impulse response function corresponding to a timing away from said ideal sampling timing by said phase error of said associated A/D converter, and values of said digital signal converted by said associated A/D converter.

3. A digitizer as claimed in claim 2, wherein said memory stores said impulse response function based on gain characteristics of said associated A/D converter.

4. A digitizer as claimed in claim 2 or 3, wherein said memory stores said impulse response function based on frequency characteristics of said associated A/D converter.

5. A digitizer as claimed in claim 1, wherein each of said first digital filter and said second digital filter includes a memory for storing as said correction coefficient a value of an impulse response function of said digital filter at said actual sampling timing of said associated A/D converter, and said first digital filter and said second digital filter outputs said corrected signals each obtained by calculation of convolution of values of said digital signal converted by said associated A/D converter and said correction coefficient.

6. A digitizer as claimed in claim 5, wherein said memory stores said correction coefficient based on gain characteristics of said associated A/D converter.

7. A digitizer as claimed in claim 5 or 6, wherein said memory stores said correction coefficient based on frequency characteristics of said associated A/D converter.

8. A digitizer as claimed in claim 1, further comprising an interleaving unit operable to generate a data sequence obtained by arranging said corrected signals respectively output from said first digital filter and said second digital filter in a predetermined order.

9. A digitizer as claimed in claim 1, further comprising a decimation data generation unit operable to calculate a sum of said corrected signals respectively output from said plurality of digital fillers to generate decimation data, wherein each of said first digital filter and said second digital filter multiplies said digital signal output from said associated A/D converter be said correction coefficient based on:

a phase error between said ideal sampling timing at which said associated A/D converter is to sample said analog signal and said actual sampling timing at which said associated A/D converter sampled said analog signal; and a phase difference between said ideal sampling timing of said associated A/D converter and an ideal sampling timing of one of said first A/D converter and said second A/D converter that is used as a reference A/D converter.

10. A digitizer as claimed in claim 9, wherein each of said first digital filter and said second digital filter includes a memory or storing a plurality of correction coefficients obtained by decomposing a predetermined impulse response function by a polyphase decomposition and multiplying results of the polyphase decomposition by a coefficient based on said phase error, and said first digital filter and said second digital filter output said corrected signals obtained by calculation of convolution of said plurality of correction coefficients and said digital signals.

11. A digitizer as claimed in claim 10, wherein said memory of each of said first digital filter and said second digital filter stores, as said plurality of correction coefficients, values obtained by multiplying values of said impulse response function at said ideal sampling timings of said associated A/D converter by said coefficient based on said phase error.

12. A digitizer as claimed in claim 11, wherein said memory of each of said first digital filter and said second digital filter stores said plurality of correction coefficients based on a function obtained by moving said impulse response function on a time axis by a difference between a phase of said ideal sampling timing of said associated A/D converter and a phase of said ideal sampling timing of said reference A/D converter, and said phase error.

13. A digitizer for converting an analog signal output from an electronic device to a digital signal, comprising:

N A/D converters operable to convert the analog signal output from said electronic device to digital signals at different sampling timings by turns, N being an integer equal to or larger than 2;

a first interleaving unit operable to generate a first data sequence obtained by arranging said digital signals converted by said N A/D converters in a predetermined order to output said first data sequence;

N digital filters operable to receive said first data sequence output from said first interleaving unit, to calculate convolution of correction coefficients based on phase errors between ideal sampling timings at which said N A/D converters are to sample said analog signal and actual sampling timing at which said N A/D converters sampled said analog signal and said first data sequence so that each of said N digital filters generate and output decimation data containing less number of data units than data units in said first data sequence; and a second interleaving unit operable to generate a second data sequence obtained by arranging said data units in said decimation data output from each of said N digital filters in a predetermined order.

14. A digitizer as claimed in claim 13, wherein said N digital filters include memories operable to store impulse response functions for calculating said correction coefficients, and said N digital filters output signals obtained by convolution of values of said impulse response functions corresponding to timings away from said ideal sampling timings by said phase errors of associated A/D converters and values of said digital signals converted by said associated A/D converters, respectively.

15. A testing apparatus for testing an electronic device, comprising:

a pattern generator operable to generate a pattern signal and expected value signal;

a waveform shaping unit operable to shape a waveform of said pattern signal generated by said pattern generator;

a device contact unit, onto which said electronic device is to be placed, operable to supply said pattern signal shaped by said waveform shaping unit to said electronic device and to receive an analog signal output from said electronic device;

a digitizer operable to convert said analog signal output from said electronic device to a digital signal; and a determination unit operable to determine based on said expected-value signal output from said pattern generator and a signal output from said digitizer whether or not said electronic device is defective, wherein said digitizer includes:

a plurality of A/D converters including a first A/D converter and a second A/D converter for converting said analog signal output from said electronic device to digital signal at a different sampling timing from each other by turn; and a plurality of digital filters including a first digital filter receiving the converted digital signal from the first A/D converter and a second digital filter receiving the converted digital signal from the second A/D converter, each of said first digital filter and said second digital filter for obtaining a correction coefficient based on a phase error in sampling timing of said associated A/D converter, multiplying said associated converted digital signal by said correction coefficient, and outputting each corrected digital signal.

16. A testing apparatus as claimed in claim 15, wherein said digitizer further includes a decimation data generation unit operable to calculate a sum of said corrected signals respectively output from said plurality of digital filters to generate decimation data, wherein:

said first digital filter and said second digital filter output said corrected signals obtained by multiplying said digital signals converted by set associated A/D converters by said correction coefficients based on:

phase errors between said ideal sampling timings at which said associated A/D converters are to sample said analog signal and said actual sampling timing at which said first and said second A/D converters sampled said analog signal; and phase differences between said ideal sampling timings of said associated A/D converters and ideal sampling timings of one of said first and said second A/D converters that is used as a reference.

17. A testing apparatus for testing an electronic device, comprising:

a pattern generator operable to generate a pattern signal and an expected-value signal;

a waveform shaping unit operable to shape a waveform of said pattern signal generated by said pattern generator;

a device contact unit, onto which said electronic device is to be placed, operable to supply said pattern signal shaped by said waveform shaping unit to said elec tronic device and to receive an analog signal output from said electronic device;

a digitizer operable to convert said analog signal output from said electronic device to a digital signal; and a determination unit operable to determine based on said expected-value signal output from said pattern generator and a signal output from said digitizer whether or not said electronic device is defective, wherein said digitize includes:

a plurality of A/D converters including a first A/D converter and a second A/D converter for converting said analog signal output from said electronic device to digital signal at a different sampling timing from each other by turn;

a first interleaving unit operable to generate and output a first data sequence obtained by arranging said digital signals converted by said first and said second A/D converters in a predetermined order;

a plurality of digital filters including a first digital filter receiving the converted digital signal from the first A/D converter and a second digital filter receiving the converted digital signal from the second A/D converter, each of said first digital filter and said second digital filter receiving said first data sequence output from said first interleaving unit and calculateing convolution of correction coefficient, and said first data sequence to generate and output decimation data, said decimation data of each of said each of said first digital filter and said second digital filter containing less number of data units than data units in said first data sequence; and a second interleaving unit operable to generate a second data sequence obtained by arranging said data units in said decimation data output from said first and said second digital filters in a predetermined order.

* * * * *